(12) United States Patent
Lugt

(10) Patent No.: US 8,718,991 B2
(45) Date of Patent: May 6, 2014

(54) PREDICTION OF RELUBRICATION INTERVAL

(75) Inventor: Pieter Martin Lugt, Vianen (NL)

(73) Assignee: Aktiebolaget SKF, Gothenburg (SE)

( * ) Notice: Subject to any disclaimer, the term of this patent is extended or adjusted under 35 U.S.C. 154(b) by 126 days.

(21) Appl. No.: 12/992,817

(22) PCT Filed: May 14, 2008

(86) PCT No.: PCT/EP2008/003861
§ 371 (c)(1),
(2), (4) Date: Jan. 31, 2011

(87) PCT Pub. No.: WO2009/138106
PCT Pub. Date: Nov. 19, 2009

(65) Prior Publication Data
US 2011/0125475 A1    May 26, 2011

(51) Int. Cl.
*G06G 7/48* (2006.01)
*G06F 17/50* (2006.01)

(52) U.S. Cl.
CPC ............................... *G06F 17/5018* (2013.01)
USPC .................................................. 703/7; 703/6

(58) Field of Classification Search
USPC .................................................. 703/27, 6–7
See application file for complete search history.

(56) References Cited

U.S. PATENT DOCUMENTS

| | | | |
|---|---|---|---|
| 4,528,852 A | 7/1985 | Sohoel | |
| 4,728,943 A | 3/1988 | Vermeiren | |
| 5,210,704 A | 5/1993 | Husseiny | |
| 5,602,761 A | 2/1997 | Spoerre et al. | |
| 2003/0047386 A1* | 3/2003 | Sherrington | 184/7.4 |
| 2005/0154542 A1 | 7/2005 | Frerichs et al. | |

FOREIGN PATENT DOCUMENTS

WO    WO0004361 A1    1/2000

OTHER PUBLICATIONS

Huke., "Embedding Nonlinear Dynamical systems: A Guide to Takens' Theorem"., Mar. 2006., The University of Manchester.*
Janijarasjitt et al. ("Bearing condition diagnosis and prognosis using applied nonlinear dynamical analysis of machine vibration signal")., Apr. 2008., ScienceDirect., p. 112-126.*

* cited by examiner

*Primary Examiner* — Eunhee Kim
(74) *Attorney, Agent, or Firm* — Bryan Peckjian; SKF USA Inc. Patent Department

(57) ABSTRACT

The invention relates to a method of predicting when a grease in a grease-lubricated rolling element bearing (10) will reach an unacceptable condition. According to the invention, a time series of a parameter is measured and recorded, whereby the parameter is directly or indirectly indicative of a degree of breakdown of a lubricant film separating the rolling contacts. With the aid of processing means (22), the time series is analyzed, a dynamic model is constructed that predicts the evolution of parameter values, and the model is used to extrapolate the time series. A time at which a predefined limit will be exceeded is then determined from the extrapolated time series, whereby the predefined limit is representative of unacceptable grease condition. The method according to the invention can be used to predict a relubrication interval for an individual grease-lubricated bearing.

19 Claims, 5 Drawing Sheets

PREDICTION OF RELUBRICATION INTERVAL

TECHNICAL FIELD

The invention concerns a device and method of predicting when a grease in a grease-lubricated rolling element bearing will reach an unacceptable condition.

BACKGROUND

If rolling element bearings are to operate reliably, they must be adequately lubricated to prevent direct contact between the rolling elements, raceways and cage (if present). Loss of lubrication function results in friction and wear, and will quickly lead to bearing failure. Most rolling element bearings (80%) are lubricated with grease, which comprises a base oil, such as a mineral oil, and a thickener, such as a metallic soap. In a grease-lubricated bearing, oil released from the grease forms a thin film that separates the contact between rolling element and bearing raceways; the thickener plays little role in film formation. Replenishment of the oil film is vital, and the end of grease life occurs when this mechanism can no longer take place. In practice, a grease generally reaches the end of its life after many thousands of operating hours.

For obvious reasons, it is important to have an estimate of grease life, so that the grease in a bearing may be replaced before failure is likely. Relubrication interval is therefore a common term to express grease life. Currently, the estimation of relubrication intervals is based on empirical models constructed from statistical interpretations of test data. A number of test methods exist. These include the SKF R2F Test (DIN 51806), the SKF ROF Test, the FAG FE8 Test (DIN 51821) and the FAG FE9 Test. In these tests, a population of bearings lubricated with a particular grease is tested until the grease fails.

This is deemed to occur when e.g. a measured temperature exceeds a predefined maximum value (SKF ROF) or a measured torque exceeds a predefined maximum value (FAG FE8).

The aforementioned tests are laboratory performance tests, which are generally conducted under artificially severe conditions, i.e. high temperature and/or high speed and/or high load. The severe conditions are necessary in order to reduce the time required to evaluate a grease's performance, and thereby reduce testing costs. A typical duration for a grease life test is between 500 and 1500 hours, which is a mere fraction of the actual grease life of a real grease-lubricated bearing operating under normal conditions.

It must therefore be recognized that although valuable data is obtained from conventional testing methods, the severity of the conditions under which they are performed means that the tests have only a limited ability to predict the suitability of a lubricating grease for long-term use under normal conditions. Moreover, conventional grease testing methods only provide statistical data, which is then used to predict the relubrication interval for a statistical grease-lubricated bearing. No prediction can be made about the relubrication interval for a specific individual bearing.

Consequently, there is room for improvement.

SUMMARY

A first object of the present invention is to define a method of predicting a relubrication interval for a specific grease-lubricated bearing.

A second object of the invention is to define a method of predicting relubrication interval, whereby the method is based on data measured under normal operating conditions.

The aforementioned objects are achieved according to the invention by a method of predicting when a grease in a grease-lubricated rolling element bearing will reach an unacceptable condition, the method comprising the steps of:
running the grease-lubricated rolling element bearing;
measuring a parameter that is directly or indirectly indicative of a degree of breakdown of a lubricant film separating the rolling contacts, the measurement values being recorded at specific intervals over a predefined measurement period, so as to obtain a time series of parameter values;
analyzing the time series and constructing a dynamic model that predicts the evolution of parameter values;
extrapolating the time series on the basis of the dynamic model, to obtain future values of the time series;
determining from the extrapolated time series a time at which a predefined limit will be exceeded, whereby the predefined limit is representative of the unacceptable grease condition and the determined time serves as prediction of a relubrication interval for the bearing.

The present invention also defines a device that is arranged to execute the above method, the device comprising:
means to measure one or more parameters that are directly or indirectly indicative of a degree of breakdown in a lubricant film separating rolling contacts of the grease-lubricated rolling element bearing;
processing means arranged to:
record a time series of measurement values for each parameter measured when the grease-lubricated bearing is rotatably driven;
analyze each recorded time series and construct a corresponding dynamic model to predict the evolution of the measured parameter it is based on;
extrapolate each time series, based on the corresponding dynamic model, and determine therefrom a time at which a predefined limit will be reached;
output each determined time value as a prediction of when the grease will reach an unacceptable condition, where each determined time value serves as a prediction of a relubrication interval for the bearing.

When the temperature of a grease-lubricated bearing is monitored, it is found that a temperature rise occurs after start-up. This start-up phase of grease lubrication is known as the churning phase, whereby the grease is over-rolled and is pressed out of the rolling contacts. The churning leads to drag losses inside the bearing, causing a rise in temperature. Thereafter, the bearing temperature stabilizes and assumes a quasi-steady state value. The monitored temperature exhibits periods of stable temperature, interrupted by fluctuations in which the temperature rises sharply and then decreases shortly afterwards.

By simultaneously monitoring lubricant film thickness and bearing temperature, it has been found that the temperature rises coincide with a breakdown in film thickness and that the subsequent temperature decreases coincide with re-formation of the oil film. The loss of film thickness leads to metal-to-metal contact between asperities, causing a rise in temperature. The rise in temperature causes a softening in a nearby grease reservoir, e.g. grease adhering to a radially inner surface of a cage bar, resulting in the release of oil, replenishment of the oil film, and a drop in temperature. In other words, a self-healing mechanism takes place within the grease-lubricated bearing. An instance of self-healing, i.e. a loss of film thickness followed by replenishment, will hereafter be referred to as an event.

At first glance, the occurrence of events appears to be random. Several tests have been performed on grease-lubricated bearings in which a parameter indicative of lubricant film breakdown is measured at specific intervals, to obtain a time series of parameter values. The capacitance between the bearing rings is a suitable parameter, since the measured value has a direct relationship with the degree of film breakdown. Electrical contact resistance is another parameter that is directly indicative of the degree of film breakdown. Analysis of several time series of contact resistance values has shown that the time series do in fact exhibit determinism. Moreover, the deterministic part of the time series is caused by an event.

This determinism has also been found in the time series of parameters that are indirectly indicative of the degree of lubricant film breakdown. As mentioned above, the dynamic temperature behavior of the bearing is strongly dependent on the dynamic behavior of the lubricant film, and analysis of time series of temperature values has shown a consistent degree of determinism.

Given that the dynamic behavior of the lubricant film is deterministic, it is possible to build a model that predicts future events on the basis of known past events. According to the invention, this is achieved by employing the techniques of time series forecasting. A suitable parameter that is directly or indirectly indicative of the degree of lubricant film breakdown is measured at specific intervals to obtain a time series of parameter values. The time series is then analyzed using the theory of non-linear dynamics.

Reconstruction of the phase space (parameters varying in time) of a system from a scalar time series is the basis of almost all methods exploring the dynamic properties of data. This is technically solved by means of an embedding method. Takens' time-delay embedding theorem may suitably be applied.

Thus, in the method according to the invention, the step of analyzing the time series comprises estimating the embedding dimension, m, and may further comprise estimating the time delay, T.

In a next step, an m-dimensional phase pace is reconstructed from the analyzed time series. The reconstructed phase space is a characterization of the dynamic behavior of the grease lubricated bearing, measured during the measurement period. In order to predict the future dynamic behavior, a prediction model is built on the basis of the reconstructed time series. Suitably, this comprises a step of estimating a model function that evolves the phase space from one system state to a next. Once again, several mathematical techniques may be applied to estimate the model function. Using the model function, the time series can be extrapolated to predict future events.

The end of grease life in a bearing is often defined in terms of a catastrophic temperature, at which the lubricant film will no longer be capable of being replenished. Based on the extrapolated time series, a prediction can be made of when a predefined (catastrophic) value will be reached. The corresponding time may be taken as a predicted relubrication interval for the tested bearing, and may serve as an absolute deadline for replacing the grease in that bearing.

The method according to the invention is not restricted to modeling the dynamic behavior on the basis of a temperature time series. Any time series of a measurable parameter that is directly or indirectly indicative of lubricant film breakdown can be used to model the system dynamics, and a relubrication interval can be determined by selecting a suitable maximum limit (catastrophic value).

The method and device according to the invention enable a prediction of relubrication interval for a particular bearing lubricated with a particular grease and operating under normal conditions. This is in contrast with known methods and devices, which predict a statistical relubrication interval for a bearing population. As will be appreciated, a method and device according to the present invention is particularly advantageous for grease-lubricated bearings in vital and expensive machinery. If the initial grease distribution in a particular bearing is poor, for example, the real relubrication interval may be significantly shorter than the interval predicted by previously known models. A grease-lubricated bearing monitored by a device according to the invention can be relubricated in good time, thereby preventing unexpectedly early failures.

As stated, the device and method according to the invention can be used to predict a relubrication interval for an individual bearing. In addition, the device and method according to the invention can be used on a large population of grease-lubricated bearings, in order to obtain statistical grease failure rates and failure distributions. The L10 life a grease, which represents a running time at which 10% of a tested population has failed, may thus be calculated. The advantage of calculating L10 life by means of the method according to the invention is that the resulting prediction of grease life is based on bearings operating under practical conditions, and not the severe conditions used in conventional tests in order to keep testing costs down. Other advantages of the present invention will become apparent from the detailed description and accompanying drawings.

BRIEF DESCRIPTION OF THE DRAWINGS

The invention will now be described in more detail for explanatory and in no sense limiting purposes with reference to the following figures, in which FIG. 1a-1c respectively show a time series graph of temperature, a time series graph of lubricant film breakdown, and a graph of cross correlation between temperature and film breakdown.

DETAILED DESCRIPTION

Figure 1A:
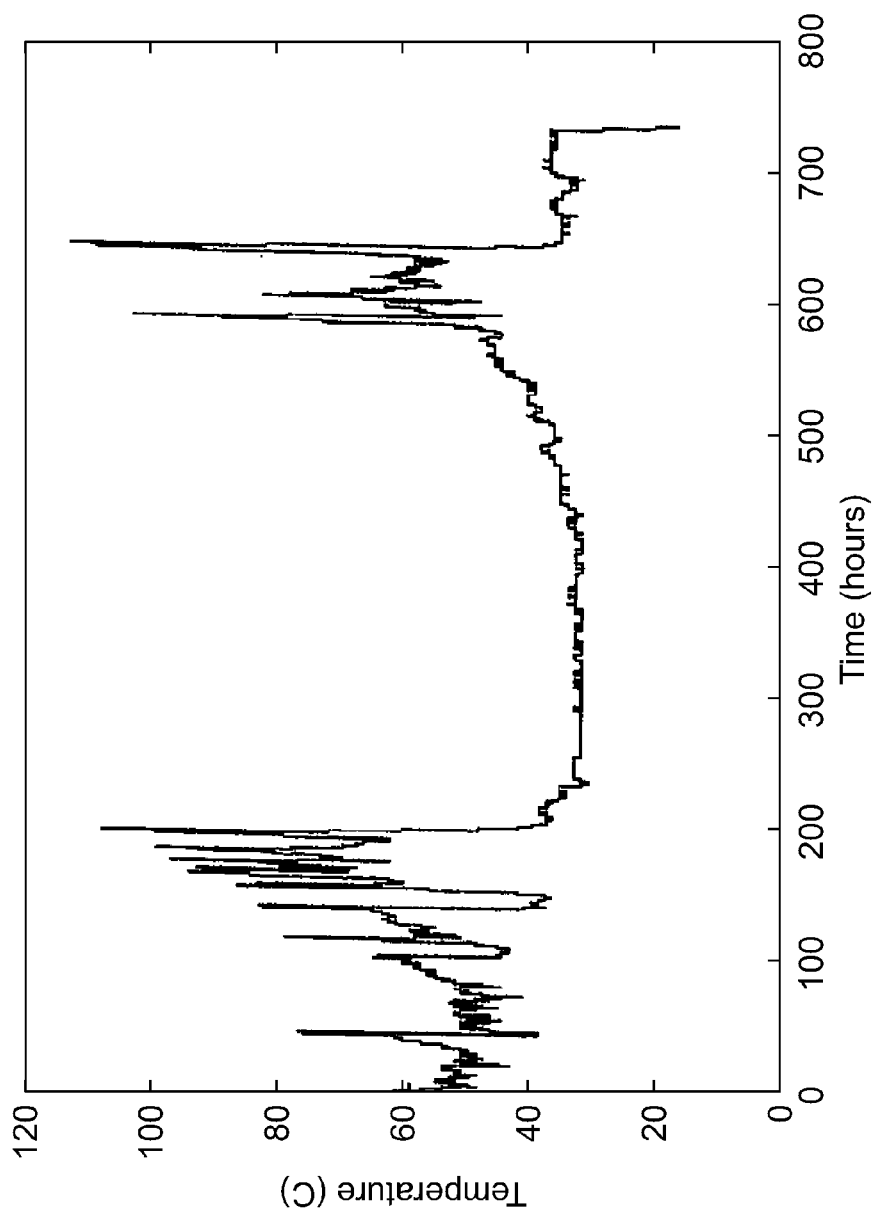

FIG. 1a shows a time series graph of bearing temperature obtained from a test conducted on a cylindrical roller bearing lubricated with a conventional Li-soap grease. The bearing was run under a load of 8.34 kN and at a speed of 1500 rpm. Bearing temperature was measured on an outer ring of the bearing, at a sampling interval of 120 seconds.

From FIG. 1a, it can be seen that a sharp rise in temperature occurs immediately after start-up. This is generally ascribed to churning of the (cold) grease within the bearing, whereby the grease is over-rolled and gets squeezed out of the rolling contacts. The churning gives drag losses inside the bearing, leading to a temperature rise. This initial phase of grease lubrication, known as the churning phase, is also when grease migration takes place. The centrifugal forces act on the grease and fling it radially outwards. A radially inner side of a cage bar is therefore one location where grease tends to gather and form a reservoir. The churning phase lasts for about 2-5 hours, after which the temperature stabilizes and assumes a quasi-steady state value. As may be seen from FIG. 1a, the temperature does not remain constant, but undergoes a series of sharp rises followed by sharp falls, back to the quasi-steady state value.

It might be thought that the series of temperature peaks is the result of further churning, i.e. temporary excessive lubrication caused by lumps of grease breaking off from the bulk and entering the rolling contacts. However, tests in which bearing temperature and lubricant film breakdown have been measured simultaneously show that the rises in temperature are linked to a breakdown in film thickness.

The results of one such test can be seen in FIG. 2b, which shows a time series graph of lubricant film breakdown, obtained during the same bearing test described above. Simultaneously with the bearing temperature measurements (shown in FIG. 2a), the electrical contact resistance between the cylindrical rollers and a bearing raceway was measured at a sampling interval of 120 seconds. The measured resistance changes in direct relation with the degree of film breakdown, and is therefore one parameter that can be used to quantify the dynamic behavior of the lubricant film. Capacitance between the inner and outer bearing rings is another parameter that can be used. As may be seen by comparing FIG. 1a and FIG. 1b, periods of relatively high bearing temperature correspond to periods of relatively low electrical contact resistance (film breakdown).

Figure 1B:
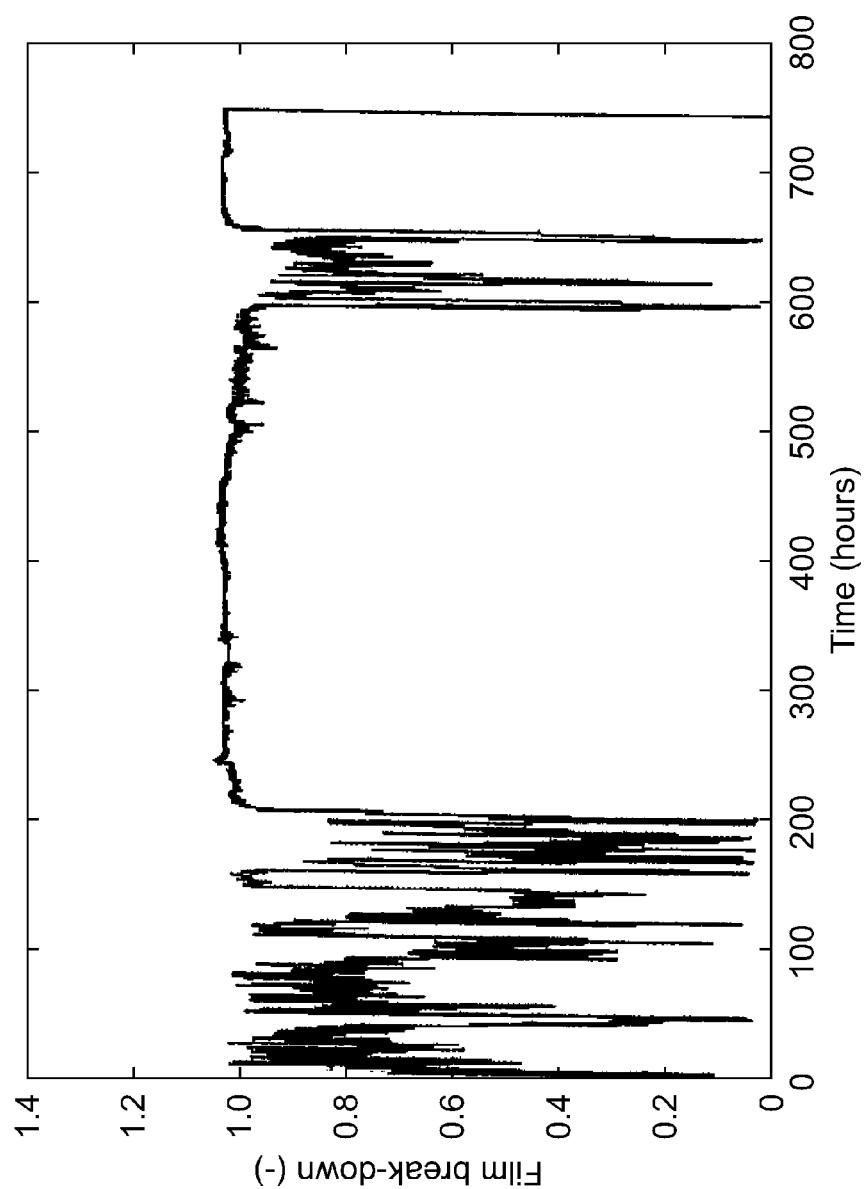
Figure 1C:
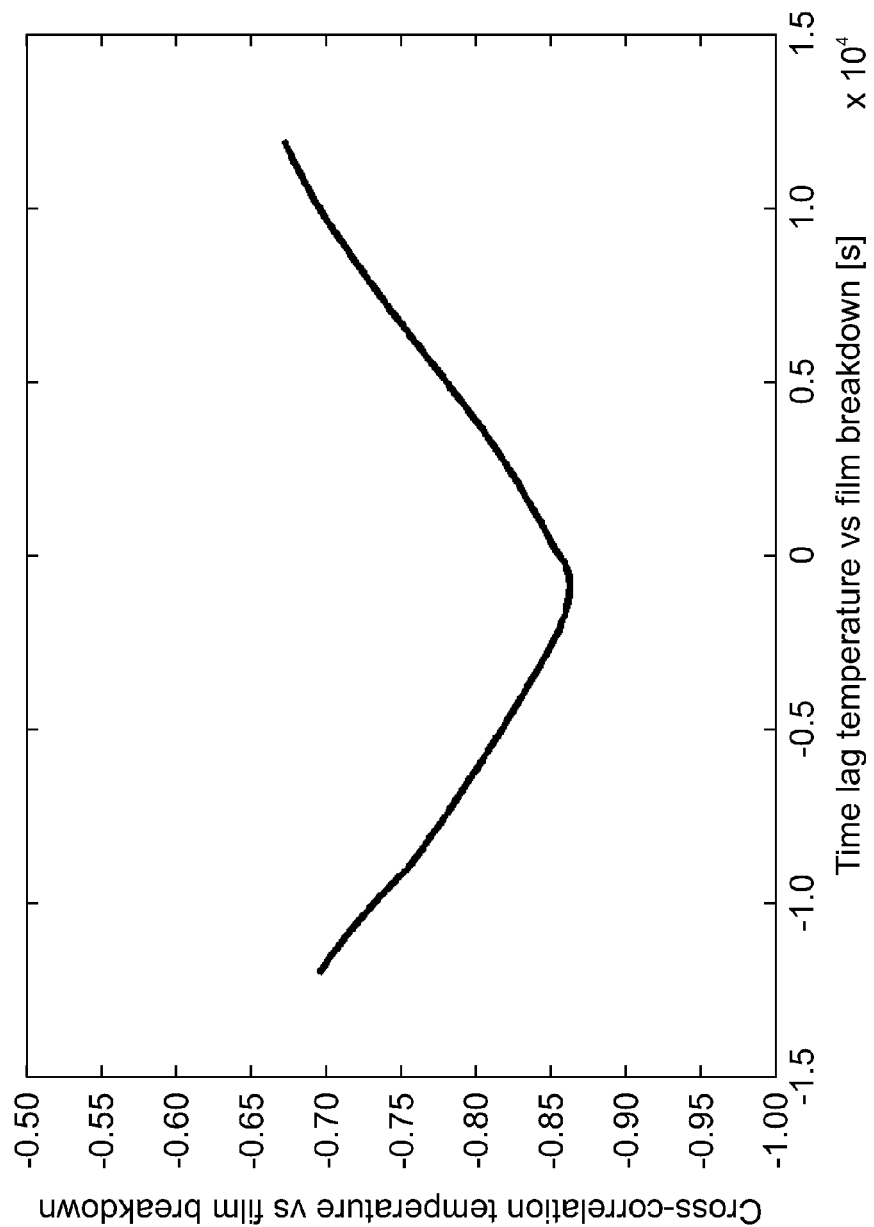

To quantify the relation between temperature and film breakdown, the cross-correlation function between the temperature dynamics and film breakdown dynamics has been determined from several tests. FIG. 1c shows a graph of the cross-correlation function obtained for the measured data shown in FIG. 1a and FIG. 1b, plotted as a function of time lag. FIG. 1c shows a maximum (negative) value of 0.858 at a time lag of 10 minutes, indicating a strong correlation between temperature rise and drop in contact resistance, i.e. film breakdown.

Consequently, the series of temperature peaks observed in FIG. 1a are not due to excessive lubrication (churning), but are due to insufficient lubrication. After the initial churning phase, the grease is assumed to release oil via a bleeding process, and the released oil forms the lubricant film that separates the rolling contacts. The bleeding process does not release enough lubricant to the rolling contacts for fully-flooded lubrication conditions, meaning that a progressive starvation occurs. The thickness of the lubricant film eventually reaches a level where metal-to-metal contact occurs between the asperities on opposing rolling contact surfaces. The consequent rise in friction increases the generation of heat. The heat is presumed to soften a nearby grease reservoir (e.g. under a cage bar), leading to the release of fresh grease for lubrication and an increase in oil bleeding rate (which rate is known to be strongly temperature-dependent). The breakdown in film thickness causes a rise in temperature, which creates the conditions for the release of fresh lubricant to replenish the lubricant film, which in turn causes the temperature to fall again. In other words, a self-healing mechanism takes place, and continues to take place until replenishment of the lubricant film is no longer possible.

The temperature peaks observed in FIG. 1a can therefore be ascribed to instances of self-healing, which will be referred to as events. Several tests have been performed on identical bearings, lubricated with the same grease, under the same operating conditions. The temperature time series and contact resistance time series obtained from these tests were different in each case. The events occurred after different intervals, had various durations, and a range of different magnitudes (e.g. temperature rises) were observed. The occurrence of events appears random, but respective analysis of the time series obtained for temperature and contact resistance has revealed that there is a remarkable degree of self-similarity in the events. Each time series reveals that the dynamic behavior (regarding temperature and film breakdown) is deterministic, whereby the deterministic part of the time series is caused by an event. Events are caused by loss of film thickness followed by replenishment, and the dynamic behavior of the system may therefore be characterized by measuring any parameter that is directly indicative of film breakdown, such as electrical contact resistance, or any parameter that is indirectly indicative of film breakdown, such as temperature.

According to the invention, dynamic film breakdown behavior is modeled on the basis of past events, to enable the prediction of future events. Suitably, this involves analyzing a time series of a measured parameter, e.g. bearing temperature, using techniques of non-linear dynamics. Reconstruction of the phase space (parameters varying in time) of a system from a scalar time series is the basis of almost all methods exploring the dynamic properties of data. This is technically solved by means of an embedding method. Takens' time-delay embedding theorem may suitably be applied.

According to Takens' theorem, the dynamics of a time series $\{x_1, x_2, \ldots, x_N\}$ are fully captured or embedded in m-dimensional phase space, defined by the state vectors:

$$Y_t = \{x_t, x_{t-\tau}, x_{t-2\tau}, \ldots, x_{t-(m-1)\tau}\}$$

where $x_t$ is the value of the time series at time t, T is a suitable time delay and m is the embedding dimension, which is the minimum number of time-delay coordinates needed so that the trajectories of the state vectors do not intersect in m dimensions.

Several methods exist for estimating the time delay and embedding dimension. The time delay may be estimated by means of e.g. a mutual information method, whereby an average mutual information (AMI) function is calculated for the time series and the time delay is chosen to coincide with the first minimum of the AMI function. The time delay may also be estimated from autocorrelation and power spectrum functions or the degree of separation function. Methods for estimating the embedding dimension include false nearest neighbors analysis and computation of the fractal correlation dimension. With the aid of a neural network, an empirical method of estimating both the time delay and the embedding dimension may also be employed.

In the tests conducted, as previously described, analysis of the temperature and contact resistance time series and calculation of the associated embedding dimension consistently resulted in an embedding dimension of five. This implies that, for a grease-lubricated cylindrical roller bearing, five parameters are needed to build a mathematical model describing the dynamic temperature behavior in the bearing or the dynamic lubricant film behavior. Moreover, Lyaponov exponents have been calculated for the various time series obtained. Lyapunov exponents are dynamic invariants related to the average rates of divergence and/or convergence of nearby trajectories in phase space. A positive maximum Lyapunov exponent indicates a dynamic system governed by deterministic chaos, i.e. a system where the dynamic behavior is exceptionally sensitive to the initial conditions. The maximum Lyapunov exponent, $\lambda_{max}$, calculated from the various time series consistently lay in the narrow range $1.14 < \lambda_{max} < 1.21$, which is indicative of a strong deterministic character.

Since the dynamic behavior is deterministic, it can be modeled by a set of generally non-linear equations. Several dynamic modeling techniques can be applied that aim to build a mathematical model from a single scalar time series that is capable of predicting the evolution of the time series.

The first step in the dynamic modeling process is to reconstruct a phase space from the measured time series. This can be done using the technique of Takens' time-delay embedding, as described above.

A prediction model can then be built:

$$y(t+T) = f_T(y(t))$$

where the phase space y(t) is the current state of the system, y(t+T) is the state of the system after a time interval, T, and $f_T$ is a model function that evolves the reconstructed phase space from one system state to the next.

In a next step, the model function is estimated. This can be done by means of continuous time models (global models) that make use of differential equations or difference equations, or by means of e.g. discrete autoregressive models (local models). Various techniques and methods may be applied in order to obtain a prediction model from a single time series. Once the model function has been estimated, it can be applied to predict the future dynamics of the system, i.e. to extrapolate the time series.

The end of grease life in a bearing is generally defined in terms of a catastrophic temperature, at which the lubricant film will no longer be capable of being replenished. Based on an extrapolated time series of future dynamic temperature behavior, a prediction can be made of when a predefined (catastrophic) value will be reached. According to the invention, the corresponding time interval may be taken as a predicted relubrication interval for the measured bearing, and may serve as an absolute deadline for replacing the grease in that bearing. To enhance the accuracy of the prediction, it is important that a suitable value is selected for the catastrophic bearing temperature. The value may be determined on the basis of experimental observations or may be obtained from grease data sheets.

Figure 2:
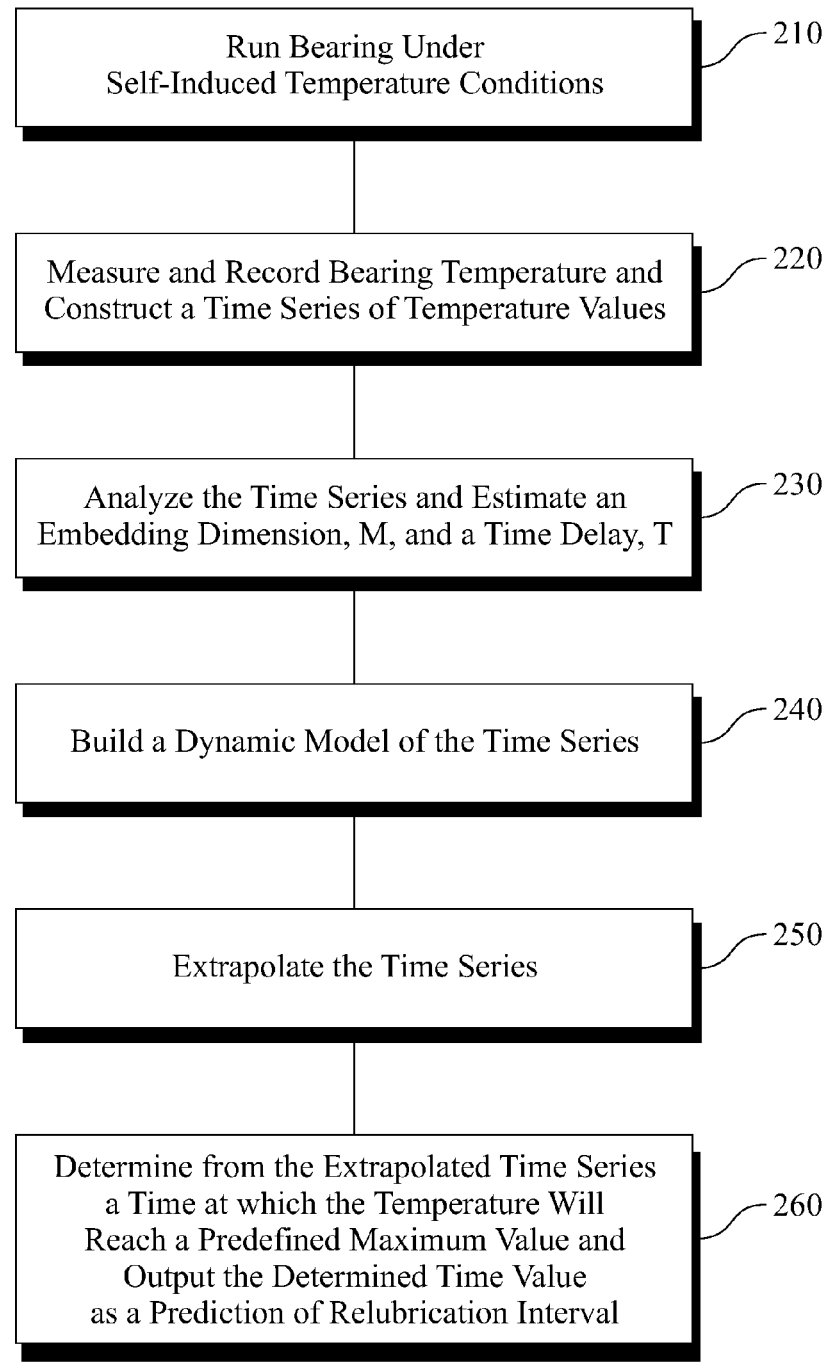
FIG. 2 shows a flow chart of a method of predicting relubrication interval according to the invention.

The present invention therefore defines a method of predicting a relubrication interval for a grease-lubricated rolling element bearing. An embodiment of the method according to the invention, based on temperature measurement, is illustrated by the flowchart of FIG. 2.

In a first step 210, a grease lubricated rolling element bearing is run preferably at constant load and speed, whereby any rise in temperature is self-induced.

In a second step 220, bearing temperature is measured at suitable sampling intervals (e.g. between 3 seconds and 3 minutes) and recorded for a predefined measurement period, in order to obtain a time series of temperature data. Suitably, the measurement period can start after 2-5 hours of bearing operation, i.e. after a lubrication churning phase, and may have a duration of e.g. 500 hours.

In a third step 230, the time series is analyzed. Suitably the step of analyzing comprises estimating an embedding dimension, m, and may further comprise estimating a time delay, T. The step of analysis may also comprise calculation of the Lyapunov exponents.

In a fourth step 240, a dynamic model is constructed for the recorded temperature dynamics. Suitably, this step comprises constructing an m-dimensional phase space of the time series and estimating a model function that evolves the phase space from one system state to a next system state.

In a fifth step 250, the dynamic model is used to extrapolate the time series to predict temperature behavior.

In a sixth step 260, a time interval at which a predefined maximum temperature value is reached is determined from the extrapolated time series, whereby the determined time interval serves as a prediction of the relubrication interval for the grease-lubricated bearing.

Figure 3:
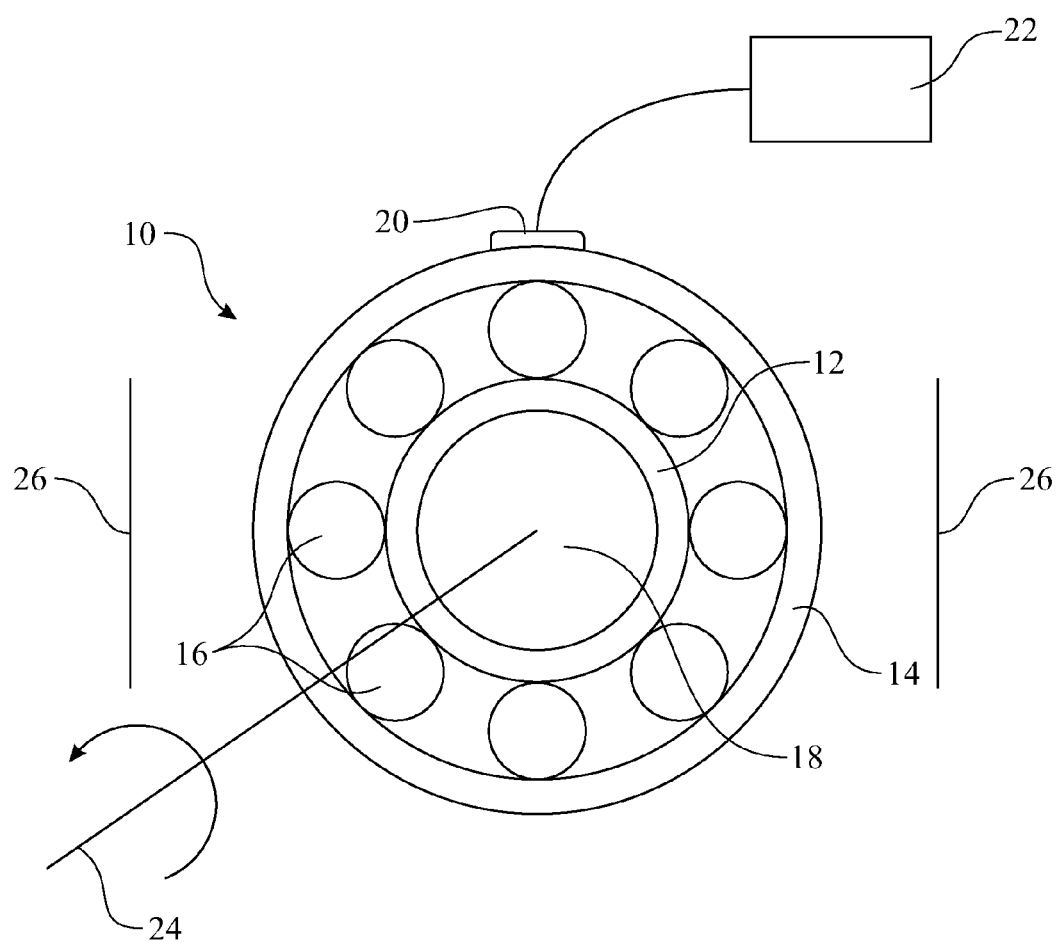
FIG. 3 shows a schematic representation of a system provided with an embodiment of a device according to the invention.

The present invention also defines a device that is adapted to execute the method according to the invention. FIG. 3 schematically illustrates an example of a system comprising at least one grease-lubricated rolling element bearing 10, which system is provided with a device 20, 22 according to the invention. The rolling element bearing 10 comprises an inner ring 12, an outer ring 14 and rolling elements 16 disposed therebetween on at least one set of opposing raceways. The rolling elements 16 may be guided and retained in a cage (not shown). The bearing 10 may be mounted on a shaft 18 of e.g. an industrial machine or it may be mounted on the shaft of a test rig. The test rig may also be adapted to support and run several bearings at the same time. The system comprising the bearing 10 will further comprise some drive member 24 to drive the bearing, such as an electric motor.

The bearing 10 is filled with a grease (not shown). To predict a relubrication interval for the bearing 10, the system is provided with a device according to the invention. The device comprises means 20 to measure a parameter that is indicative of a degree of breakdown in a lubricating film separating rolling contacts of the bearing 10, and further comprises a processing unit 22 that is arranged to perform the steps of the method according to the invention. In the embodiment shown in FIG. 3, the measurement means is a temperature sensor 20 mounted on the bearing outer ring 14. Since most bearings are adapted for inner ring rotation, while the outer ring is held fixed, the outer ring is the most straightforward temperature measurement location. However, the temperature sensor 20 could also be mounted on the bearing inner ring 12, or on the cage, with a connection to the temperature sensor 20 achieved by means of e.g. slip rings or telemetry. The bearing may also be adapted for outer ring rotation.

The grease-lubricated bearing 10 is run under normal operating conditions, i.e. it is run under loads above the minimum to avoid skidding, but is not subjected to excessive load or run at exceptionally high speed or heated to excessive temperature. The temperature that develops in the bearing may be self induced. At suitable sampling intervals (e.g. between 3 seconds and 3 minutes), the measured temperature values are recorded, thereby producing a time series of temperature data. The temperature may be measured and recorded during a measurement period of e.g. 800 hours. According to the invention, the processing unit 22 analyzes the time series and outputs a predicted relubrication interval on the basis of the steps described with reference to the flowchart of FIG. 2. The processing unit 22 can suitably comprise a neural network.

The embodiments of the method and device according to the invention have been described with reference to measuring a time series of temperature data and determining relubrication interval on the basis of a catastrophic temperature value. The method and device according to the invention are not restricted to the measurement of this parameter, but may be based on any parameter that is directly or indirectly indicative of lubricant film breakdown. For example, the metal-to-metal contact between asperities that occurs due to lubricant film breakdown produces friction. Thus, a device according to the invention can comprise means to measure bearing friction torque and relubrication interval can be determined on the basis of a time series of torque values and a suitably selected catastrophic torque value. Similarly, a device according to the invention can comprises means to measure power consumption of e.g. an electric motor 24 that drives the rolling element bearing. The power needed to keep a bearing running at the same speed will increase in a direct relationship with the amount of friction in the bearing. Correspondingly, relubrication interval can be predicted on the basis of a time series of power consumption values and a suitably selected catastrophic power consumption value.

The device according to the invention can also comprise means to measure and record a time series of a parameter that is directly indicative of lubricant film breakdown, such as the capacitance between the outer and inner bearing rings. As described, loss of film thickness generates heat, which leads to replenishment of the lubricant film when the grease is in a condition that allows this. When replenishment is no longer possible, the metal-to-metal contact will continue for a catastrophic duration that ultimately leads to bearing failure. Therefore, a minimum capacitance value that is indicative of metal-to-metal contact can be selected, and a certain duration of this value can be set as the catastrophic limit when predicting relubrication interval from an extrapolated time series of capacitance values. The same principle may be applied to a time series of electrical contact resistance values.

In the embodiments of the method according to the invention described above, the step of running the bearing is preferably conducted at constant speed and load. The temperature development in the bearing may be self-induced. Alternatively, the step of running the bearing may be performed under controlled temperature conditions, whereby heating means (heating elements 26 of FIG. 3) are employed to maintain bearing temperature at a predefined setpoint. A crucial factor here is that the setpoint temperature is suitably selected so as not to mask or interfere with the events of self-healing that naturally occur as part of the lubrication mechanism. The value selected also depends on where bearing temperature is measured, since the temperature of the inner ring will be higher than the temperature of the outer ring. In terms of outer ring temperature measurement, a setpoint value of 70-100° C. may be applied. This range is consistent with the operating conditions that bearings experience in practice.

As the lubricant film breaks down, bearing temperature rises due to metal-to-metal contact. If the measured temperature exceeds the setpoint value, the heating means will automatically deactivate and then reactivate when the temperature has dropped back down below the setpoint value (due to replenishment of the lubricant film). The duration of each deactivation period of the heater can be measured and recorded, thereby creating a time series of durations. This parameter is also indicative of the degree of lubricant film breakdown in the grease-lubricated bearing and, likewise, a catastrophic duration of heater deactivation can be defined in order to determine the relubrication interval from the extrapolated time series. Thus, an SKF ROF test rig could be adapted to execute the method according to the invention.

As will be understood, more than one parameter that is directly or indirectly indicative of lubricant film breakdown can be measured and recorded. A dynamic model may be constructed for each recorded time series and relubrication interval may be separately determined from the extrapolation of each time series. The predicted interval is dependent on the catastrophic value that is selected for each time series, and since the value differs depending on the parameter values of the time series, it is likely that the determination of relubrication interval will produce different predictions. For reasons of safety, the smallest of the predicted intervals may suitably be selected as the deadline for replacing the grease in the bearing.

It has been found that 500 hours is a suitable period in which to measure and record a time series. As will be understood, the accuracy of the dynamic model constructed from a time series can be improved by increasing the duration of the measurement period. Thus, the steps of analyzing and dynamic modeling may be repeated, for example, every 200 hours after the initial measurement period, to refine the predicted interval. Moreover, if several parameters are measured and a time series of each parameter is analyzed and dynamically modeled, the model functions estimated from each dynamic model can be compared and calibrated against each other.

A number of aspects/embodiments of the invention have been described. It is to be understood that each aspect/embodiment may be combined with any other aspect/embodiment. Moreover the invention is not restricted to the described embodiments, but may be varied within the scope of the accompanying patent claims.

REFERENCE NUMERALS

FIG. 2—illustrates an embodiment of the method according to the invention,
210 run bearing under self-induced temperature conditions;
220 measure and record bearing temperature and construct a time series of temperature values;
230 analyze the time series and estimate an embedding dimension, m, and a time delay, T;
240 build a dynamic model of the time series;
250 extrapolate the time series;
260 determine from the extrapolated time series a time at which the temperature will reach a predefined maximum value and output the determined time value as a prediction of relubrication interval.
FIG. 3—illustrates a system provided with an embodiment of a device according to the invention,
10 grease-lubricated rolling element bearing
12 inner ring
14 outer ring
16 rolling elements
18 shaft
20 temperature sensor
22 processing unit
24 drive member
26 heating element

The invention claimed is:

1. A method of predicting when a grease in a grease-lubricated rolling element bearing will reach an unacceptable condition, the method comprising the steps of:
running the grease-lubricated bearing;
measuring a parameter, the parameter being one of directly and indirectly indicative of a degree of breakdown of a lubricant film thickness provided by a layer of oil separating the rolling contacts, where measurement values are recorded at specific intervals over a predefined measurement period, so as to obtain a time series of parameter values;
analyzing the time series and constructing a dynamic model that predicts the evolution of parameter values;
extrapolating the time series, based on the dynamic model, to predict future values of the time series; and
determining a time at which a value of the extrapolated time series will exceed a predefined limit, whereby said predefined limit is representative of the unacceptable grease condition.

2. The method according to claim 1, wherein the time determined from the extrapolated time series serves as a prediction of a relubrication interval of the rolling element bearing.

3. The method according to claim 1, wherein the step of running the bearing is performed at a constant load and speed.

4. The method according to claim 1, wherein the measurement period begins after an initial churning phase of bearing lubrication has ended.

5. The method according to claim 1, wherein:
the step of measuring includes measuring a plurality of parameters indicative of the degree of lubricant film breakdown, such that a time series is obtained for each of the measured parameters;
the step of analyzing includes analyzing each individual time series and constructing a corresponding dynamic model that predicts the evolution of the corresponding time series;
the step of extrapolating includes extrapolating each time series;
the step of determining includes determining from each extrapolated time series a time at which a predefined limit will be exceeded.

6. The method according to claim 1, wherein the step of measuring includes measuring bearing temperature and the predefined limit in the step of determining is a maximum temperature value.

7. The method according to claim 1, wherein the step of measuring includes measuring power consumption of a drive means that powers the running of the bearing and the predefined limit in the step of determining is a maximum power consumption value.

8. The method according to claim 1, wherein the step of measuring includes measuring a parameter that is directly indicative of the degree of lubricant film breakdown.

9. The method according to claim 8, wherein the measured parameter is one of a capacitance of the bearing and an electrical contact resistance of the bearing and the predefined limit in the step of determining is one of a duration of a minimum capacitance value and a duration of a minimum electrical contact resistance value.

10. The method according to claim 1, wherein the step of analyzing includes estimating an embedding dimension, m, and a time delay, T, for each time series.

11. The method according to claim 1, wherein the step of analyzing further includes calculating the Lyapunov exponents for each time series.

12. The method according to claim 10, wherein the step of constructing a dynamic model includes constructing an m-dimensional phase space for each time series.

13. The method according to claim 12, wherein the step of constructing a dynamic model further includes estimating a model function for the dynamics, which model function evolves the reconstructed phase space from one state to a next state.

14. The method according to claim 1, wherein the step of running the bearing is performed such that any rise in bearing temperature is a self-induced temperature rise.

15. The method according to claim 1, wherein the step of running the bearing is performed under controlled temperature conditions, whereby heating means are employed to maintain bearing temperature at a predefined setpoint.

16. The method according to claim 15, wherein the step of measuring includes measuring successive durations between automatic deactivation and reactivation of the heating means and the predefined limit in the step of determining is a maximum duration value.

17. A device for predicting when a grease in a grease-lubricated bearing will reach an unacceptable condition, the device being coupleable to a system including at least one grease-lubricated rolling element bearing, the device comprising:
means to measure at least one parameter, the at least one parameter being at least indirectly indicative of a degree of breakdown in a lubricant film formed between rolling elements and raceways of the bearing; and
processing means configured to:
record a time series of measurement values for each parameter measured when the grease-lubricated bearing is rotatably driven;
analyze each recorded time series and construct a corresponding dynamic model to predict the evolution of the measured parameter it is based on;
extrapolate each time series, based on the corresponding dynamic model, and determine from each extrapolated time series a time at which a predefined catastrophic value will be reached;
output each determined time value as a prediction of when the grease will reach an unacceptable condition;
employ a heating means to maintain bearing temperature at a predetermined setpoint; and
measure successive durations between automatic deactivation and reactivate of the heating means and the predefined limit in the step of determining is a maximum duration value.

18. The device according to claim 17, wherein the processing means includes a neural network.

19. A system comprising:
at least one grease-lubricated rolling element bearing;
a heating and control means to maintain bearing temperature at a predefined setpoint;
a device for predicting when a grease in the grease-lubricated bearing will reach an unacceptable condition, the device including:
means to measure at least one parameter, the at least one parameter being at least indirectly indicative of a degree of breakdown in a lubricant film formed between rolling elements and raceways of the bearing;
processing means configured to:
record a time series of measurement values for each parameter measured when the grease-lubricated bearing is rotatably driven;
analyze each recorded time series and construct a corresponding dynamic model to predict the evolution of the measured parameter it is based on;
extrapolate each time series, based on the corresponding dynamic model, and determine from each extrapolated time series a time at which a predefined catastrophic value will be reached; and
output each determined time value as a prediction of when the grease will reach an unacceptable condition;
measure successive durations between automatic deactivation and reactivate of the heating means and the predefined limit in the step of determining is a maximum duration value; and
wherein the bearing is running under controlled temperature conditions, whereby heating means are employed to maintain bearing temperature at a predefined setpoint.

* * * * *